United States Patent
Lin et al.

(10) Patent No.: US 7,371,628 B2
(45) Date of Patent: May 13, 2008

(54) METHOD FOR FABRICATING SEMICONDUCTOR DEVICE

(75) Inventors: Cha-Hsin Lin, Hsinchu (TW); Zing-Way Pei, Hsinchu (TW); Chee-Wee Liu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 166 days.

(21) Appl. No.: 11/228,340

(22) Filed: Sep. 19, 2005

(65) Prior Publication Data
US 2006/0263959 A1    Nov. 23, 2006

(30) Foreign Application Priority Data
May 20, 2005    (TW) .............................. 94116605 A

(51) Int. Cl.
*H01L 21/336* (2006.01)
(52) U.S. Cl. ............... 438/197; 438/199; 257/E27.108
(58) Field of Classification Search ............... 438/197, 438/199; 257/E27.108, E29.13
See application file for complete search history.

(56) References Cited

U.S. PATENT DOCUMENTS

| 6,919,282 B2* | 7/2005 | Sakama et al. ............. 438/769 |
|---|---|---|
| 7,153,735 B2* | 12/2006 | Sashida ....................... 438/239 |
| 2004/0262692 A1* | 12/2004 | Hareland et al. ........... 257/369 |
| 2005/0208776 A1* | 9/2005 | Krishnan et al. ........... 438/770 |
| 2005/0215069 A1* | 9/2005 | Currie et al. ............... 438/762 |
| 2005/0233514 A1* | 10/2005 | Bu et al. ..................... 438/199 |
| 2005/0247926 A1* | 11/2005 | Sun et al. ..................... 257/19 |
| 2005/0275108 A1* | 12/2005 | Saiki et al. ................. 257/758 |
| 2006/0024873 A1* | 2/2006 | Nandakumar et al. ...... 438/197 |
| 2006/0223290 A1* | 10/2006 | Belyansky et al. ......... 438/520 |
| 2007/0063186 A1* | 3/2007 | Rao ............................ 257/18 |

OTHER PUBLICATIONS

C.-H. Ge et al., "Process-Strained Si(PSS) CMOS Technology Featuring 3D Strain Engineering", 2003 IEEE.
A. Shimizu, et al., "Local Mechanical-Stress Control (LMC): A New Technique for CMOS-Performance Enhancement", 2001 IEEE.

* cited by examiner

*Primary Examiner*—Thao P. Le
(74) *Attorney, Agent, or Firm*—Rabin & Berdo, P.C.

(57) ABSTRACT

A method for fabricating a semiconductor device is provided. The method mainly involves steps of forming at least one first patterned high stress layer below a silicon substrate, then forming a semiconductor device onto the substrate, and forming at least one second patterned high stress layer on the semiconductor device. According to the method, the characteristics of the PMOS and the NMOS transistors formed on the same wafer may be improved simultaneously, by utilizing the stress of the patterned layers of high stress material. Further, the mobility of the carriers is enhanced, so that the output characteristic of the transistors can be improved.

27 Claims, 9 Drawing Sheets

METHOD FOR FABRICATING SEMICONDUCTOR DEVICE

This Non-provisional application claims priority under 35 U.S.C. § 119(a) on Patent Application No(s). 94116605 filed in Taiwan on May 20, 2005, the entire contents of which are hereby incorporated by reference.

BACKGROUND

1. Field of Invention

The present invention relates to a method for fabricating a semiconductor device, and more particularly, a method for fabricating a semiconductor device by modulating the stresses the semiconductor device is subjected to using the stresses of patterned high stress layers.

2. Related Art

As for the p-type metal oxide semiconductor field effect transistor (PMOS) and the n-type metal oxide semiconductor field effect transistor (NMOS), since the PMOS transistor needs to be applied with compressive stress in the channel area to improve its hole mobility, whereas the NMOS needs to be applied with tensile stress to improve its electron mobility, the forms of stresses to improve the carrier mobility in the channel area are exactly opposite.

Because the magnitude and form of stress of a silicon nitride film, deposited once as a whole, are fixed, in the past, only one of the PMOS and the NMOS transistors on the same wafer could be chosen to apply thereto the stress of a particular form to improve its characteristics. For example, the technique proposed by Taiwan Semiconductor Manufacture Company (TSMC) in the International Electron Devices Meeting (IEDM) in 2003 discloses a method for improving the characteristics of the transistors by means of using stresses in different directions, that is, when the tensile stress in the x-axis direction, i.e. a direction parallel to the channel of the transistor, is increased, the characteristic of the PMOS transistor will be reduced but that of the NMOS transistor can be enhanced; when the tensile stress in the y-axis, i.e. a direction perpendicular to the channel of the transistor, is increased, the characteristics of the NMOS transistor and the PMOS transistor can be enhanced simultaneously. However, when the tensile stress in the z-axis direction, i.e. a direction perpendicular to the surface of the substrate, is increased, the characteristic of the PMOS transistor will be enhanced but that of the NMOS transistor will be reduced. Therefore, to apply stresses in different directions can affect the characteristics of the transistors differently, that is to say, the conventional techniques generally can only improve the characteristic of a single transistor type, but cannot improve the characteristics of the PMOS and the NMOS transistors simultaneously.

SUMMARY

In view of the abovementioned problem, the present invention provides a method for fabricating a semiconductor device by which the problem that exists in the prior art can be solved substantially.

The method uses the high stress layers as cap-layers under the silicon substrate and above the semiconductor device, and applies appropriate stresses to the silicon substrate and the semiconductor device by using the stresses of the patterned high stress layers. The stresses can generate stresses of particular directions on the surface of the silicon substrate and in the channel area of the semiconductor device, thereby enhancing the carrier mobility of the transistors and enhancing the characteristics of a PMOS transistor and a NMOS transistor simultaneously.

The first embodiment of the method for fabricating a semiconductor device disclosed by the present invention includes the following steps: providing a silicon substrate; forming at least one first patterned high stress layer below the silicon substrate; forming a semiconductor device on the silicon substrate, and forming at least one second patterned high stress layer on the semiconductor device.

The second embodiment of the method for fabricating a semiconductor device disclosed by the present invention includes the following steps: providing a silicon substrate; forming at least one patterned high stress layer below the silicon substrate; and forming a semiconductor device on the silicon substrate.

The third embodiment of the method for fabricating a semiconductor device disclosed by the present invention includes the following steps: providing a silicon substrate; providing a semiconductor device, which is formed on the silicon substrate; and forming at least one patterned high stress layer on the semiconductor device.

According to the object and principle of the present invention, the patterned high stress layer may be a monolayer or multilayer, and the materials that can provide certain stresses are compounds such as BPSG, PSG, BSG, TEOS, SiNx and SiOxNy, etc.

Compared with the prior art and according to the object and principle of the present invention, the present invention introduces appropriate stresses to the silicon substrate and semiconductor device by using a patterned silicon nitride film layer, whereby the stresses can generate certain stresses of particular directions on the surface of the silicon substrate and at the channel area of the semiconductor device, which makes the particular direction of the silicon substrate and semiconductor device be subjected to stresses. According to the object and principle of the present invention, the invention modulates the stresses that the silicon substrate and semiconductor device are subjected to in different directions by using the stresses generated by the patterned high stress layer(s), for enhancing the characteristics of the PMOS and the NMOS transistors simultaneously.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given in the illustration below only, and thus is not limitative of the present invention, wherein.

DETAILED DESCRIPTION

To make the object, construction, features and functions of the present invention be further appreciated, a detailed description is made hereafter with reference to the embodiments. The description of the content of the invention above and that of the embodiments hereinafter are given by way of exemplifying and illustrating the principle of the invention, and providing further explanation of the claims of the invention.

Now refer to FIG. 1A through FIG. 1D, which are fabricating steps of the method for fabricating a semiconductor device according to the invention. The order of the steps is not unchangeable or indispensable; in fact some steps can be carried out simultaneously, omitted or added. These fabricating steps are intended to describe the features of steps of the invention in an extensive and simple way but not to limit the order and number of the fabricating steps of the invention.

Figure 1A:
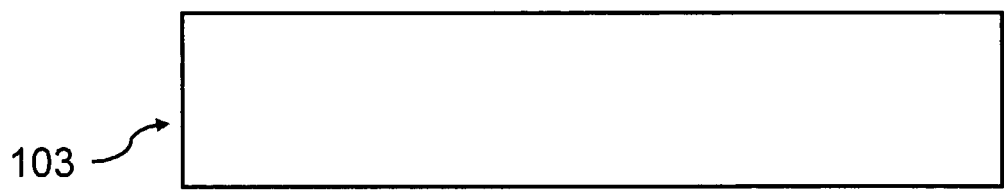
FIG. 1A through FIG. 1D illustrate the first embodiment of the method for fabricating a semiconductor device disclosed by the invention.

First, a silicon substrate 103 is provided as shown in FIG. 1A. The silicon substrate can be a common silicon substrate or a thin silicon substrate, which is formed mechanically or by process treatment.

Figure 1B:
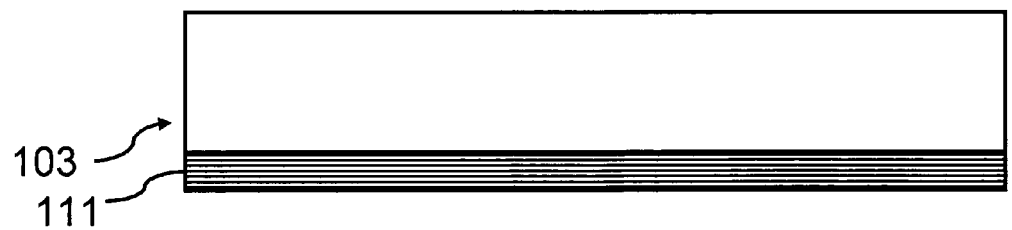

Then, below the silicon substrate 103, i.e. at the wafer back section, at least one first patterned high stress layer 111 is formed as shown in FIG. 1B. The first patterned high stress layer 111 applies a strong force onto the silicon substrate 103 so as to change the atomic structure on the surface of the silicon substrate 103 and generate a certain magnitude and form of stress in a particular direction of the substrate 103, which can be tensile stress or compressive stress. The first patterned high stress layer 111 can be a monolayer or multilayer, and the material of the first patterned high stress layer 111, for example, can be selected from the silicon nitride, silicon nitride and silicon dioxide film laminates and organic or inorganic materials that can generate magnitudes of stress, e.g., the compounds such as BPSG, PSG, BSG, $SiO_2$, $SiO_xN_y$, etc. The first patterned high stress layer 111 can be formed below the silicon substrate 103 by a chemical vapor deposition (CVD) or a liquid phase deposition (LD), and then, the first patterned high stress layer 111 may be etched by dry etching or wet etching.

Figure 1C:
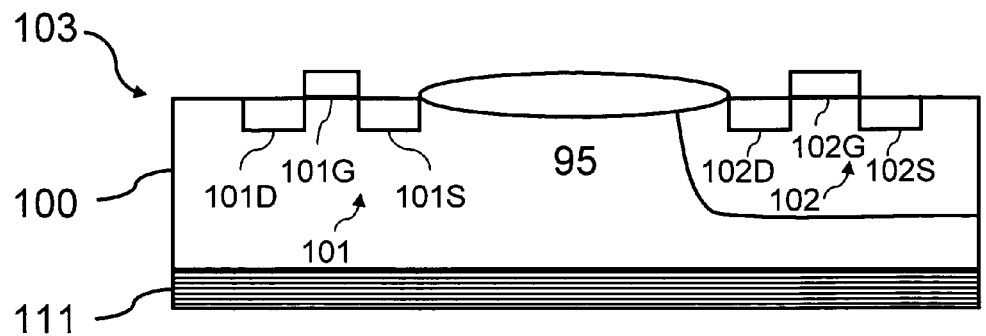

Afterwards, on the silicon substrate 103 is formed a semiconductor device 100, which has more than one p-type metal oxide semiconductor field effect transistor (PMOS) 101 and more than one n-type metal oxide semiconductor field effect transistor (NMOS) 102. Only one is shown in the drawings by way of illustration, in which the PMOS 101 and the NMOS 102 each include a gate 101G, 102G, a source 101S, 102S and a drain 101D, 102D, as shown in FIG. 1C.

Figure 1D:
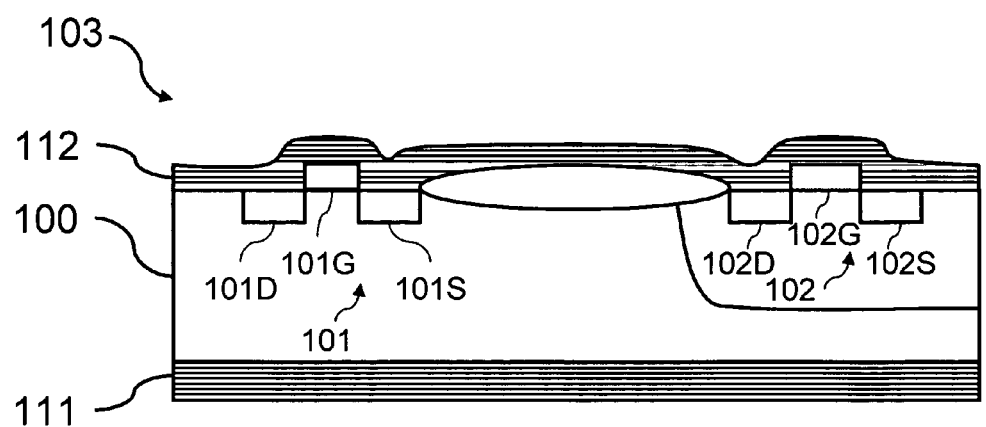

At last, at least one second patterned high stress layer 112 is formed on the semiconductor device 100, to act as a cap-layer for covering the p-type metal oxide semiconductor field effect transistors and the more than one n-type metal oxide semiconductor field effect transistor, as shown in FIG. 1D. The second patterned high stress layer 112 is affected by the gates 101G and 102G of the transistors 101 and 102 in the semiconductor device 100, and may generate magnitudes of stress in particular directions of the transistor channel area in the semiconductor device 100 that are capable of modulating the magnitudes of stress the channel area of the semiconductor device 100 is subjected to in different directions. In this embodiment, the second patterned high stress layer 112 can be a monolayer or multilayer, and the material of the second patterned high stress layer 112, for example, can be selected from the silicon nitride, silicon nitride and silicon dioxide film laminates and organic or inorganic materials that can generate magnitudes of stress, e.g., the compounds such as BPSG, PSG, BSG, $SiO_2$, $SiO_xN_y$, etc. The second patterned high stress layer 112 may be formed above the semiconductor device 100 by a chemical vapor deposition (CVD) or a liquid phase deposition (LD), and then, the second patterned high stress layer 112 may be etched by dry etching or wet etching. The first and second patterned high stress layers 111 and 112 can be accomplished in one process simultaneously or in different processes.

Figure 2A:
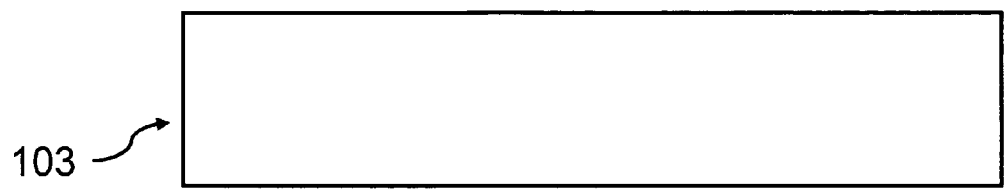
FIG. 2A through FIG. 2C illustrate the second embodiment of the method for fabricating a semiconductor device disclosed by the invention.
Figure 2B:
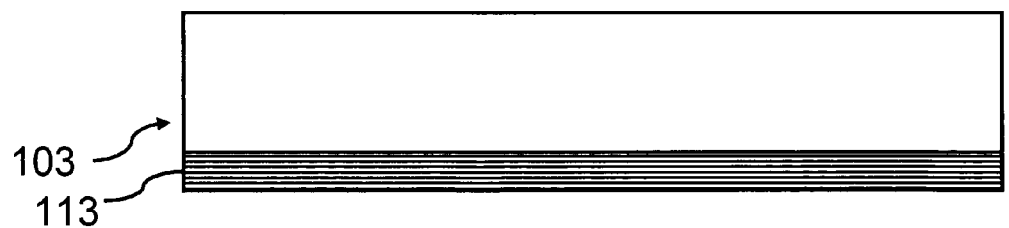
Figure 2C:
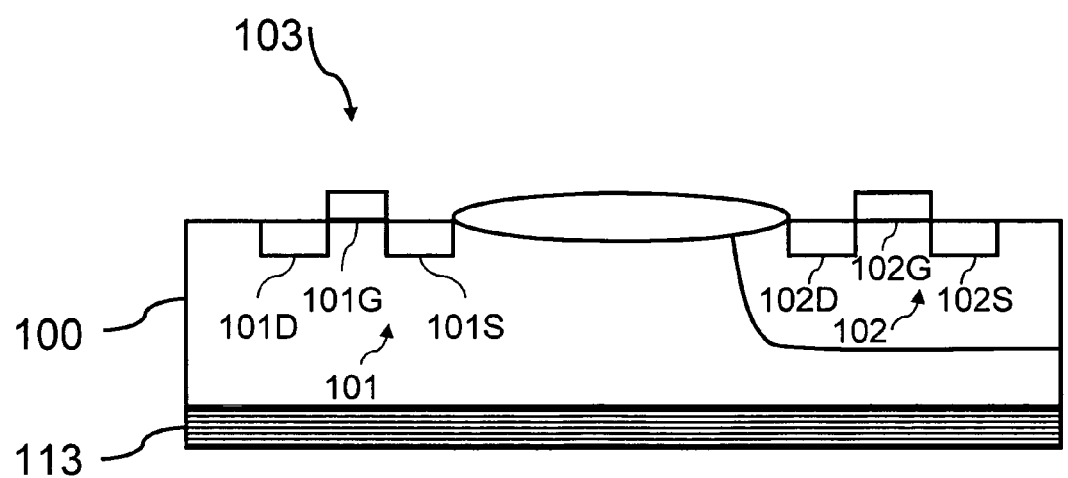

FIGS. 2A-2C illustrate the second embodiment of the method for fabricating a semiconductor device 100, disclosed by the present invention. First, a silicon substrate 103 is provided as shown in FIG. 2A. The silicon substrate 103 can be a common silicon substrate or a thin silicon substrate, which is formed mechanically or by process treatment.

Then, below the silicon substrate 103, i.e. at the wafer back section, at least one patterned high stress layer 113 is formed as shown in FIG. 2B. The patterned high stress layer 113 applies a strong force onto the silicon substrate 103 so as to change the atomic structure on the surface of the silicon substrate 103 and generate in a particular direction of substrate 103 a certain magnitude and form of stress, which can be tensile stress or compressive stress. The patterned high stress layer 113 can be a monolayer or multilayer, and the material of the patterned high stress layer 113, for example, can be selected from the silicon nitride and silicon dioxide film laminates and organic or inorganic materials that can generate magnitudes of stress, e.g., the compounds such as BPSG, PSG, BSG, $SiO_2$, $SiO_xN_y$, etc. The patterned high stress layer 113 can be formed below the silicon substrate 103 by a chemical vapor deposition (CVD) or a liquid phase deposition (LD), and then, the patterned high stress layer 113 may be etched by dry etching or wet etching.

At last, on the silicon substrate 103 is formed a semiconductor device 100, which has more than one p-type metal oxide semiconductor field effect transistor (PMOS) 101 and more than one n-type metal oxide semiconductor field effect transistor (NMOS) 102. Only one is shown in the drawings by way of illustration, in which the PMOS 101 and the NMOS 102 each include a gate 101G, 102G, a source 101S, 102S and a drain 101D, 102D, as shown in FIG. 2C.

Figure 3A:
FIG. 3A through FIG. 3C illustrate the third embodiment of the method for fabricating a semiconductor device disclosed by the invention.
Figure 3B:
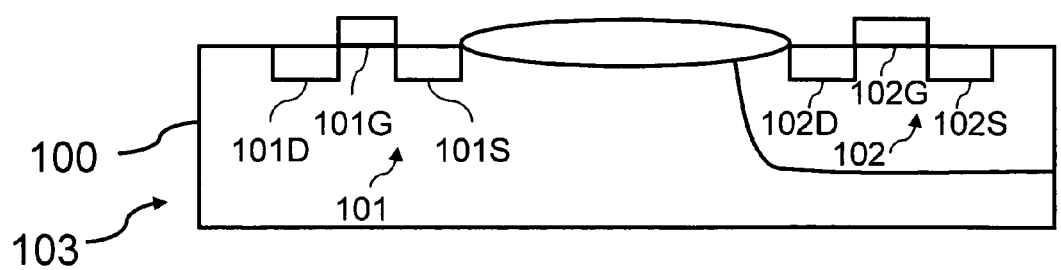
Figure 3C:
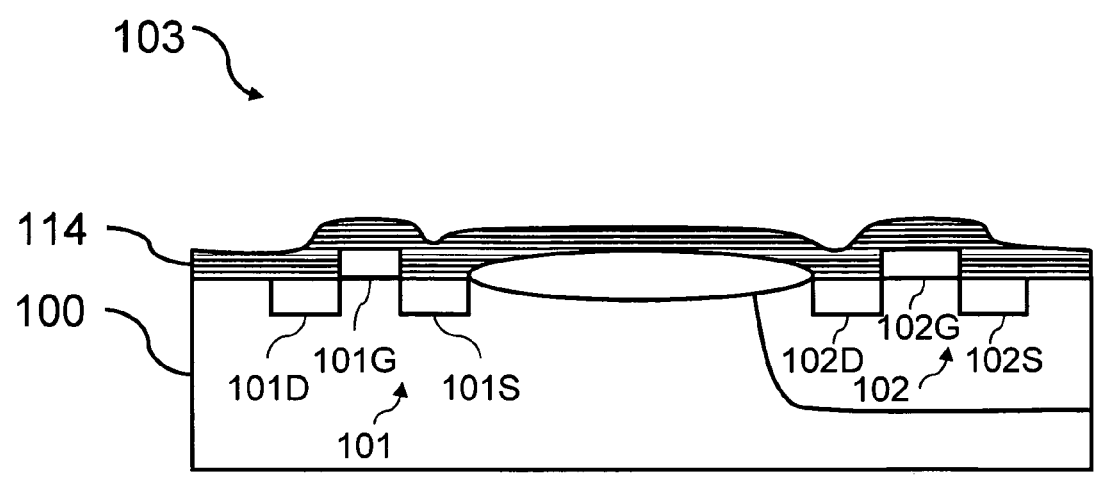

FIGS. 3A-3C illustrate the third embodiment of the method for fabricating a semiconductor device 100 disclosed by the present invention. First, a silicon substrate 103 is provided as shown in FIG. 3A. The silicon substrate 103 can be a common silicon substrate or a thin silicon substrate, which is formed mechanically or by process treatment.

Then, on the silicon substrate 103 is formed a semiconductor device 100, which has more than one p-type metal oxide semiconductor field effect transistor (PMOS) 101 and more than one n-type metal oxide semiconductor field effect transistor (NMOS) 102. Only one is shown in the drawings by way of illustration, in which the PMOS 101 and the NMOS 102 each include a gate 101G, 102G, a source 101S, 102S and a drain 101D, 102D, as shown in FIG. 3B.

At last, at least one patterned high stress layer 114 is formed on the semiconductor device 100, to act as a cap-layer for covering the p-type metal oxide semiconductor field effect transistors 101 and more than one n-type metal oxide semiconductor field effect transistor 102, as shown in FIG. 3C. The patterned high stress layer 114 is affected by the gates 101G and 102G of the transistors 101 and 102 in the semiconductor device 100, and may generate magnitudes of stress in particular directions of the transistor channel area in the semiconductor device 100 that are capable of modulating the magnitudes of stress the channel area of the semiconductor device 100 is subjected to in different directions. In this embodiment, the patterned high stress layer 114 can be a monolayer or multilayer, and the material of the patterned high stress layer 114, for example, can be selected from the silicon nitride and silicon dioxide film laminates and organic or inorganic materials that can generate magnitudes of stress, e.g., the compounds such as BPSG, PSG, BSG, $SiO_2$, $SiO_xN_y$, etc. The patterned high stress layer 114 may be formed above the semiconductor device 100 by a chemical vapor deposition (CVD) or a liquid phase deposition (LD), and then, the patterned high stress layer 114 can be etched by dry etching or wet etching.

In the above three embodiments, it is possible to appropriately modulate the thickness of the patterned high stress film laminate that covers the semiconductor device or the patterned high stress film laminate that covers the wafer back section, in order to change the magnitudes of stress the transistor channel area is subjected to in different directions. By properly employing the high stress layer on both surfaces or one surface of the silicon substrate, blocks that have a certain amount of both tensile and compressive stress in a particular direction can be created on the same silicon substrate, to enhance the characteristics of the NMOS and the PMOS respectively, thereby improving the characteristics of the CMOS elements simultaneously.

Additionally, when a silicon nitride or silicon dioxide film laminate is used as a patterned high stress layer to generate a stress source, because the silicon nitride and silicon dioxide film has a relatively high selection ratio to dry etching, this results in the effect of etch-stop, whereby it is easy to modulate the thickness of the silicon nitride or silicon dioxide film laminate on the rear of the substrate to change the stress generated in a particular direction of the silicon substrate.

The fabricating method disclosed in the present invention can also be applied to a semiconductor device comprising only one transistor type, i.e. a PMOS transistor type or a NMOS transistor type, that is to say, the method can be achieved by changing the stress state of only one transistor type.

According to the object, principle and embodiments of the invention, the experimental results of the invention are shown below. Table 1 illustrates the influences of the stresses in different directions on the characteristics of the PMOS and NMOS transistors.

TABLE 1

| Direction of applying stresses | Degree of improving the characteristics of CMOS elements | | | |
|---|---|---|---|---|
| | Tensile stress | | Compressive stress | |
| | PMOS | NMOS | PMOS | NMOS |
| Direction parallel to transistor channel area | Reduced | Enhanced | Enhanced | Reduced |
| Direction perpendicular to transistor channel area | Enhanced | Enhanced | Reduced | Reduced |
| Directions parallel to transistor channel area and perpendicular to transistor channel area | Reduced | Enhanced | Enhanced | Reduced |

Table 1 shows clearly that stresses in different directions may have different influences on the PMOS transistor or the NMOS transistor. By increasing the tensile stress in a direction perpendicular to the transistor channel area, the characteristics of the NMOS and the PMOS transistors can be enhanced simultaneously. Besides, by increasing the compressive stress in a direction perpendicular to the transistor channel area, the characteristics of the NMOS and the PMOS transistor may be decreased simultaneously. Therefore, to properly apply different stresses in different directions is an effective way to enhance the characteristics of the NMOS and the PMOS transistors.

Figure 4:
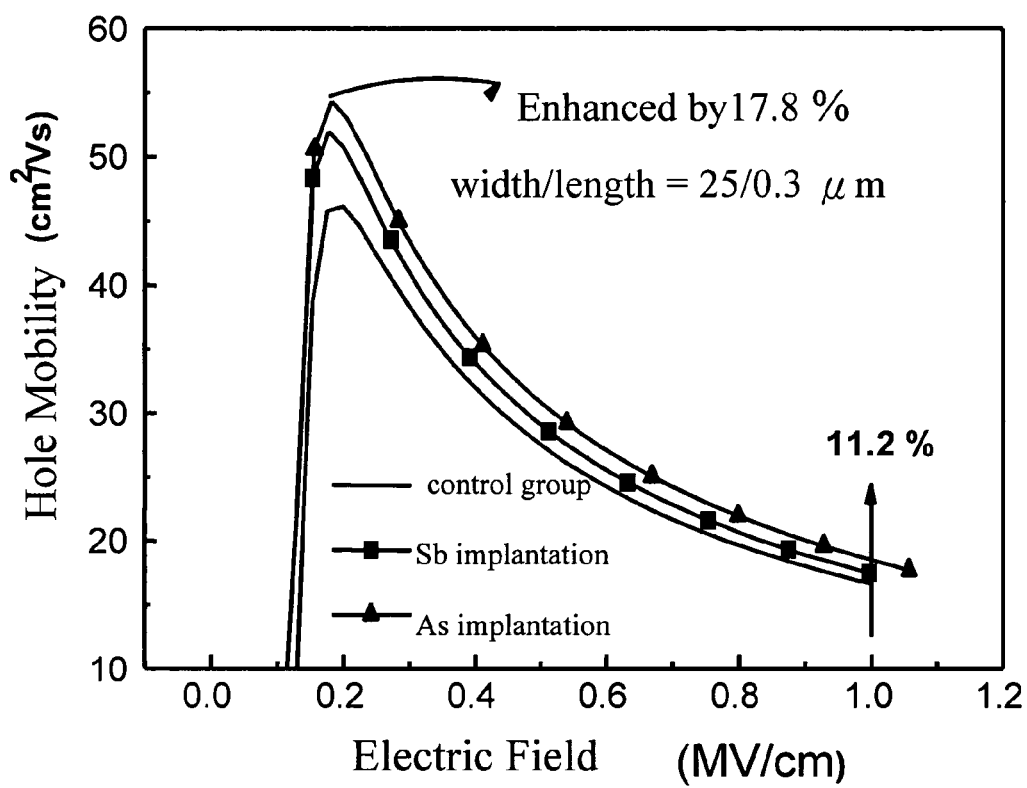
FIG. 4 illustrates the output characteristic improvement of the PMOS transistor fabricated by the fabricating method, that utilizes the patterned high stress layer as a cap-layer of the semiconductor device, in combination with stress engineering in the wafer back section.

Now refer to FIG. 4, which shows the validation of the characteristic of the PMOS transistor. FIG. 4 shows that by utilizing the patterned high stress layer as a cap-layer of the semiconductor device in combination with stress engineering in the wafer back section, to generate stresses for modulating the stresses the transistor channel area is subjected to, the carrier mobility of transistors can be increased, and thus the output characteristic of the PMOS transistor can be enhanced.

Figure 5:
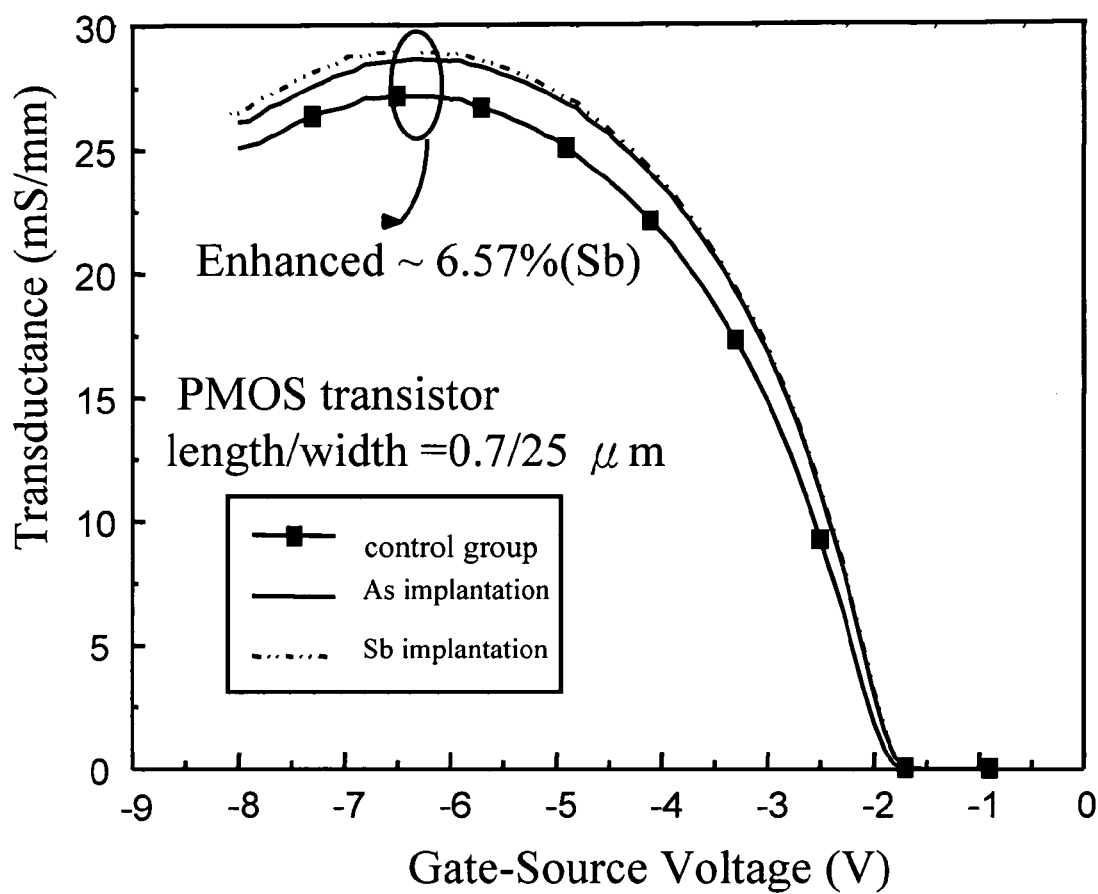
FIG. 5 illustrates the gain characteristic improvement of the PMOS transistor, fabricated by the fabricating method, that utilizes the patterned high stress layer as a cap-layer of the semiconductor device in combination with stress engineering in the wafer back section.

Now refer to FIG. 5, which demonstrates that by utilizing the patterned high stress layer as a cap-layer of the semiconductor device in combination with stress engineering in the wafer back section, the gain characteristic of the PMOS transistor can be enhanced remarkably.

Figure 6:
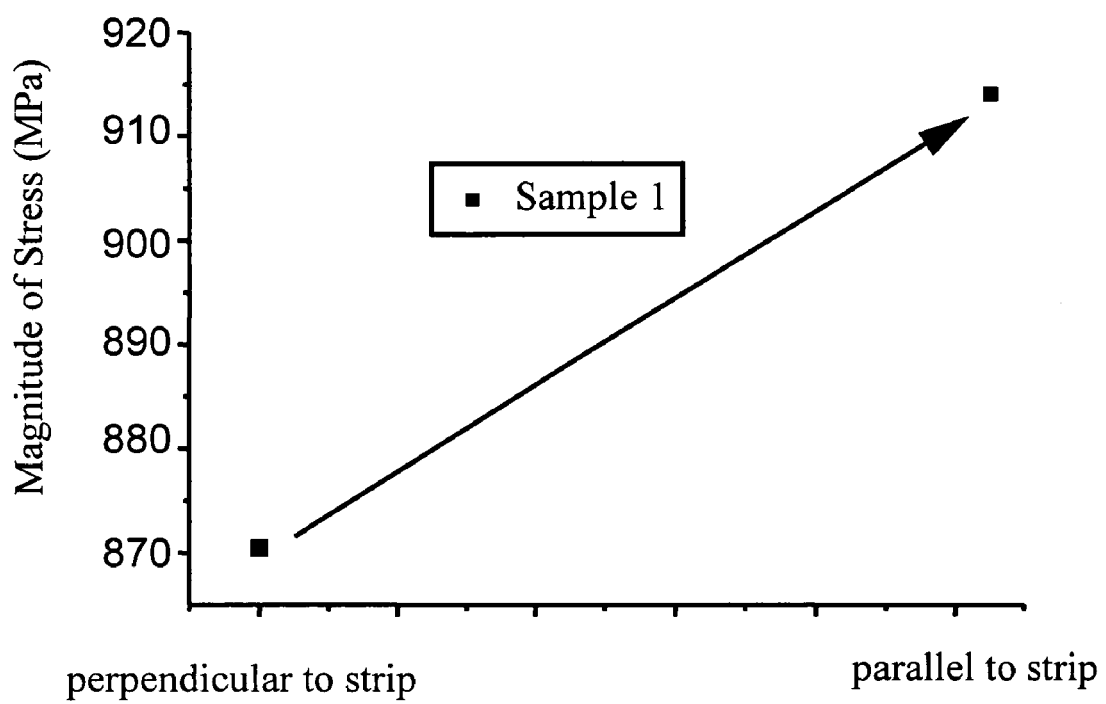
FIG. 6 illustrates the magnitudes of stress of the high stress layer measured along different directions after it is etched into strips.

Now refer to FIG. 6, which shows the magnitudes of stress of the high stress layer measured along different directions after it is etched into strips. The result indicates that the magnitude of stress the substrate is subjected to along the strip direction, is significantly different from those of other directions when the high stress silicon nitride layer is etched into strips. Therefore, the stress that the silicon substrate is subjected to in a certain direction can be effectively controlled by the pattern design.

The fabricating method disclosed in the invention, which utilizes a high stress layer as a cap-layer of the surface of the semiconductor device in combination with stress engineering in the wafer back section, for changing the magnitudes of stress, can accomplish the process of enhancing the characteristics of transistors. The CMOS of the fabricating method disclosed in the present invention is not necessary to employ a silicide process.

Knowing the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for fabricating a semiconductor device, comprising the steps of:
   providing a silicon substrate;
   forming at least one first strip-patterned high stress layer having a strip direction below the silicon substrate;
   forming a semiconductor device comprising at least one transistor channel area on the silicon substrate; and
   forming at least one second strip-patterned high stress layer having a strip direction on the semiconductor device,
   wherein each transistor channel area of the at least one transistor channel area corresponds to one strip of at least one of the first strip-patterned high stress layer and second strip-patterned high stress layer, and extends in a direction which corresponds to the strip direction of the corresponding strip.

2. The method of claim 1, wherein said semiconductor device has a plurality of metal oxide semiconductor field effect transistors (MOS) each of which is one of a p-type metal oxide semiconductor field effect transistor (PMOS) and a n-type metal oxide semiconductor field effect transistor (NMOS).

3. The method of claim 1, wherein the first patterned high stress layer and the second patterned high stress layer are made of an organic material or an inorganic material that generate certain stresses.

4. The method of claim 1, wherein the first patterned high stress layer and the second patterned high stress layer are formed by a chemical vapor deposition (CVD) or a liquid phase deposition (LD).

5. A method for fabricating a semiconductor device, comprising the steps of:
   providing a silicon substrate;
   forming at least one strip-patterned high stress layer having a strip direction below the silicon substrate; and
   forming a semiconductor device comprising at least one transistor channel area each of which corresponds to one strip of the strip-patterned high stress layer and extends in a direction which corresponds to the strip direction of the corresponding strip on the silicon substrate.

6. The method of claim 5, wherein said semiconductor device has a plurality of metal oxide semiconductor field effect transistors (MOS) each of which is one of a p-type metal oxide semiconductor field effect transistor (PMOS) and a n-type metal oxide semiconductor field effect transistor (NMOS).

7. The method of claim 5, wherein the patterned high stress layer is made of an organic material or an inorganic material that generates a certain stress.

8. The method of claim 5, wherein the patterned high stress layer is formed by a chemical vapor deposition (CVD) or a liquid phase deposition (LD).

9. A method for fabricating a semiconductor device, comprising the steps of:
   providing a silicon substrate;
   providing and forming a semiconductor device on the silicon substrate; and
   forming at least one strip-pattered high stress layer on the semiconductor device, the at least one strip-patterned high stress layer having a strip direction and comprising at least one transistor channel area each of which corresponds to one strip of the at least one strip-patterned high stress layer and extends in a direction which corresponds to the strip direction of the corresponding strip.

10. The method of claim 9, wherein said semiconductor device has a plurality of metal oxide semiconductor field effect transistors (MOS) each of which is one of a p-type metal oxide semiconductor field effect transistor (PMOS) and a n-type metal oxide semiconductor field effect transistor (NMOS).

11. The method of claim 9, wherein the patterned high stress layer is made of an organic material or an inorganic material that generates a certain stress.

12. The method of claim 9, wherein the patterned high stress layer is formed by a chemical vapor deposition (CVD) or a liquid phase deposition (LD).

13. The method of claim 2, wherein the transistor channel area of the p-type metal oxide semiconductor field effect transistor is perpendicular to the strip direction of the corresponding strip for applying tensile stress.

14. The method of claim 2, wherein the transistor channel area of the p-type metal oxide semiconductor field effect transistor is parallel to the strip direction of the corresponding strip for applying compressive stress.

15. The method of claim 2, wherein the transistor channel area of the n-type metal oxide semiconductor field effect transistor is selectively one of perpendicular to or parallel to the strip direction of the corresponding strip for applying tensile stress.

16. The method of claim 15, wherein the transistor channel area of the p-type metal oxide semiconductor field effect transistor is perpendicular to the strip direction of the corresponding strip for applying tensile stress.

17. The method of claim 15, wherein the transistor channel area of the p-type metal oxide semiconductor field effect transistor is parallel to the strip direction of the corresponding strip for applying compressive stress.

18. The method of claim 5, wherein the transistor channel area of the p-type metal oxide semiconductor field effect transistor is perpendicular to the strip direction of the corresponding strip for applying tensile stress.

19. The method of claim 5, wherein the transistor channel area of the p-type metal oxide semiconductor field effect transistor is parallel to the strip direction of the corresponding strip for applying compressive stress.

20. The method of claim 5, wherein the transistor channel area of the n-type metal oxide semiconductor field effect transistor is selectively one of perpendicular to or parallel to the strip direction of the corresponding strip for applying tensile stress.

21. The method of claim 20, wherein the transistor channel area of the p-type metal oxide semiconductor field effect transistor is perpendicular to the strip direction of the corresponding strip for applying tensile stress.

22. The method of claim 20, wherein the-transistor channel area of the p-type metal oxide semiconductor-field effect transistor is parallel to the strip direction of the corresponding strip for applying compressive stress.

23. The method of claim 9, wherein the transistor channel area of the p-type metal oxide semiconductor field effect transistor is perpendicular to the strip direction of the corresponding strip for applying tensile stress.

24. The method of claim 9, wherein the transistor channel area of the p-type metal oxide semiconductor field effect transistor is parallel to the strip direction of the corresponding strip for applying compressive stress.

25. The method of claim 9, wherein the transistor channel area of the n-type metal oxide semiconductor field effect transistor is selectively one of perpendicular to or parallel to the strip direction of-the corresponding strip for applying tensile stress.

26. The method of claim 25, wherein the transistor channel area of the p-type metal oxide semiconductor field effect transistor is perpendicular to the strip direction of the corresponding strip for applying tensile stress.

27. The method of claim 25, wherein the transistor channel area of the p-type metal oxide semiconductor field effect transistor is parallel to the strip direction of the corresponding strip for applying compressive stress.

* * * * *